(12) United States Patent
Constantinis

(10) Patent No.: US 12,078,469 B2
(45) Date of Patent: Sep. 3, 2024

(54) INSPECTION METHOD AND ASSOCIATED COMPUTER SOFTWARE

(71) Applicant: E M & I (MARITIME) LIMITED, Saint Helier (GB)

(72) Inventor: Daniel Constantinis, Naxxar (MT)

(73) Assignee: E M & I (MARITIME) LIMITED, Saint Helier (GB)

( * ) Notice: Subject to any disclaimer, the term of this patent is extended or adjusted under 35 U.S.C. 154(b) by 899 days.

(21) Appl. No.: 17/046,272

(22) PCT Filed: Apr. 10, 2019

(86) PCT No.: PCT/GB2019/051039
§ 371 (c)(1),
(2) Date: Oct. 8, 2020

(87) PCT Pub. No.: WO2019/197826
PCT Pub. Date: Oct. 17, 2019

(65) Prior Publication Data
US 2021/0080249 A1    Mar. 18, 2021

(30) Foreign Application Priority Data

Apr. 10, 2018 (GB) ...................... 1805923

(51) Int. Cl.
*G01B 11/06* (2006.01)
*G01B 11/03* (2006.01)
(Continued)

(52) U.S. Cl.
CPC .............. *G01B 11/06* (2013.01); *G01B 11/03* (2013.01); *G01B 11/24* (2013.01); *G01S 17/89* (2013.01); *G06F 30/20* (2020.01)

(58) Field of Classification Search
CPC ......... G01B 11/06; G01B 11/03; G01B 11/24; G01B 11/16; G01B 11/22; G01B 11/30; G01S 17/89; G06F 30/20; G01N 21/90
See application file for complete search history.

(56) References Cited

U.S. PATENT DOCUMENTS

2003/0090647 A1 * 5/2003 Isogai ................... G01S 7/4816
                                                        356/4.01
2004/0252288 A1 12/2004 Kacyra et al.
(Continued)

FOREIGN PATENT DOCUMENTS

AU    2012 202 036        5/2012
AU    2012202036 A1 *     5/2012 ............. B02C 23/00
(Continued)

OTHER PUBLICATIONS

United Kingdom Intellectual Property Office, Examination Report under Section 18(3) in application No. GB1805923.8, Jul. 18, 2022.
(Continued)

*Primary Examiner* — Tung S Lau
(74) *Attorney, Agent, or Firm* — Dorton & Willis LLP; Ryan Willis

(57) ABSTRACT

Method of inspecting a vessel including obtaining a first data set (14, 114) associated with a first surface (340) of at least a portion of the vessel. The first data set (14, 114) is obtained with laser scanning A model or simulation (12, 112, 212, 312) indicative of the first surface (340) is generated in dependence on the obtained first data set (14, 114). A property of the portion of the vessel is determined in dependence on the generated model or simulation (12, 112, 212, 312).

18 Claims, 14 Drawing Sheets

(51) Int. Cl.
*G01B 11/24* (2006.01)
*G01S 17/89* (2020.01)
*G06F 30/20* (2020.01)

(56) References Cited

U.S. PATENT DOCUMENTS

| | | | |
|---|---|---|---|
| 2013/0211531 A1* | 8/2013 | Steines | A61F 2/3859 623/20.14 |
| 2015/0007764 A1 | 1/2015 | Sudo et al. | |
| 2017/0246479 A1* | 8/2017 | Boisseau | A61N 5/1043 |

FOREIGN PATENT DOCUMENTS

| | | |
|---|---|---|
| CN | 202133430 | 2/2012 |
| CN | 104180771 | 12/2014 |
| CN | 107621231 | 1/2018 |
| CN | 108007374 | 5/2018 |
| GB | 2550117 | 11/2017 |
| KR | 20150128300 | 11/2015 |
| WO | 1992018829 | 10/1992 |
| WO | 2015024118 | 2/2015 |
| WO | 2017/191447 | 11/2017 |

OTHER PUBLICATIONS

UK Intellectual Property Office, Examination Report in GB1805923.8, dated Mar. 8, 2022.
United Kingdom Intellectual Property Office, Examination Report under Section 18(3) in application No. GB1805923.8, Sep. 27, 2021.
European Patent Office, Examination Report in EP 19718822.0, dated Dec. 14, 2022.
GB Intellectual Property Office, Notification of Grant in GB2572781, dated Dec. 6, 2022.
GB Intellectual Property Office, Search Report, dated Oct. 9, 2018, for Application No. GB1805923.8.
WIPO, Search Report, dated Jun. 25, 2019, for Application No. PCT/GB2019/51039.
European Patent Office, Examination Report in EP 19718822.0, dated Mar. 11, 2024.
Australian Patent Office, Examination Report in AU 2019250779, dated Nov. 29, 2023.
Brazilian Patent Office, Examination Report in BR 11 2020 020631 8, dated Apr. 24, 2024.

* cited by examiner

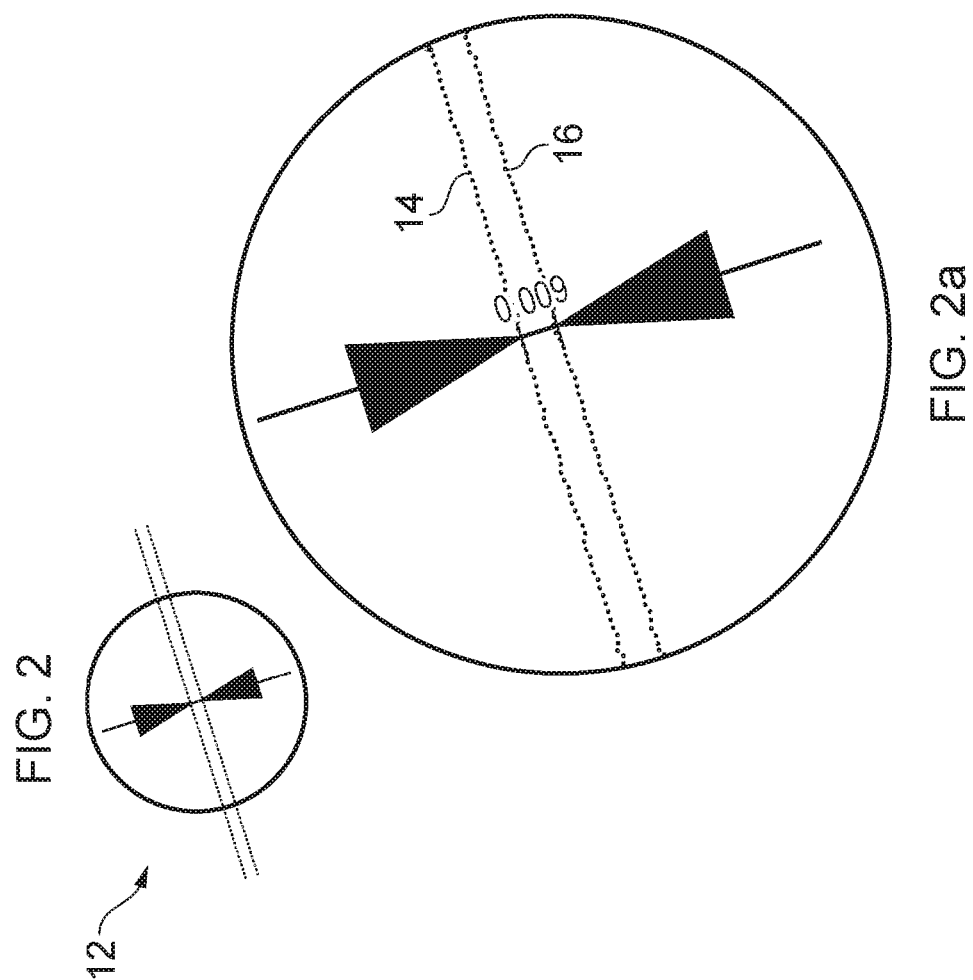
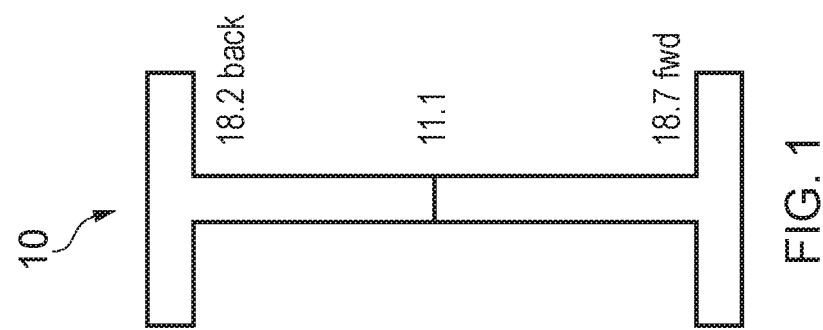

| Defect | Actual (mm) | | Measured (mm) | |
|---|---|---|---|---|
| | Depth | Width | Depth | Width |
| A | 5 | 75 | 5.1 | 76 |
| B | 2.5 | 75 | 2.9 | 78 |
| D (upper) | 5 | 54 | 5.3 | 49 |
| D (lower) | 3 | n/a | 3.6 | n/a |

| Defect | Actual (mm) | | Measured @ 2 m (mm) | | Measured @ 10 m (mm) | |
|---|---|---|---|---|---|---|
| | Depth | Width | Depth | Width | Depth | Width |
| 1 | 5 | 20 | 6 | 18-26 | n/a | n/a |
| 2 | 5 | 50 | 5 | 44-58 | 5 | 38-70 |

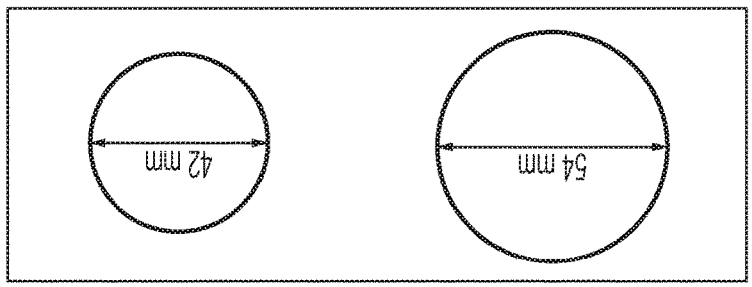
FIG. 4d
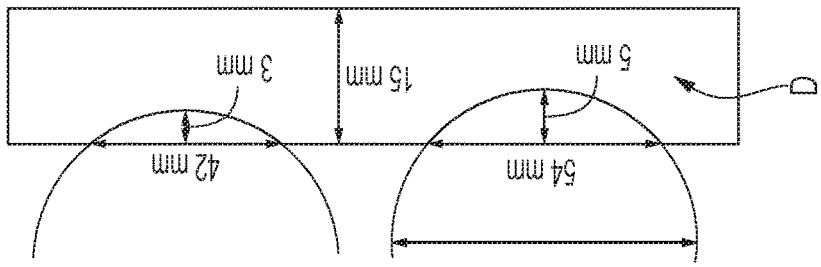
FIG. 4c
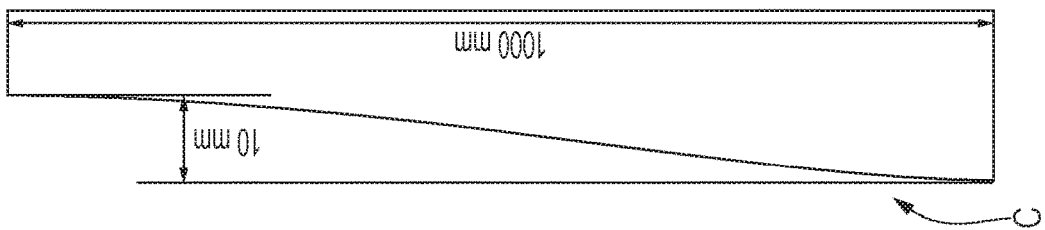
FIG. 4b
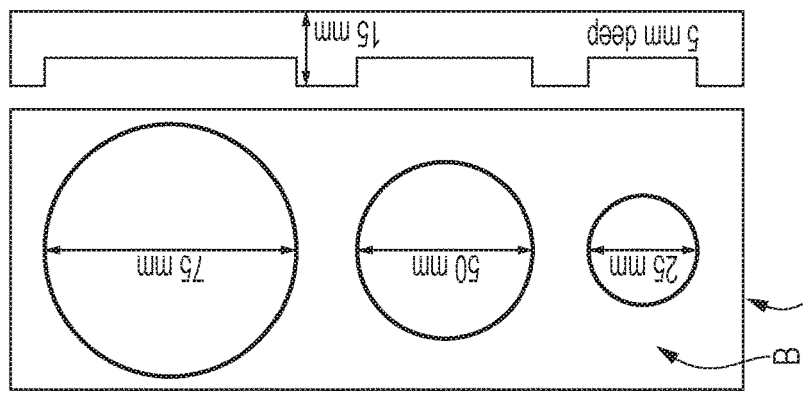
FIG. 4a
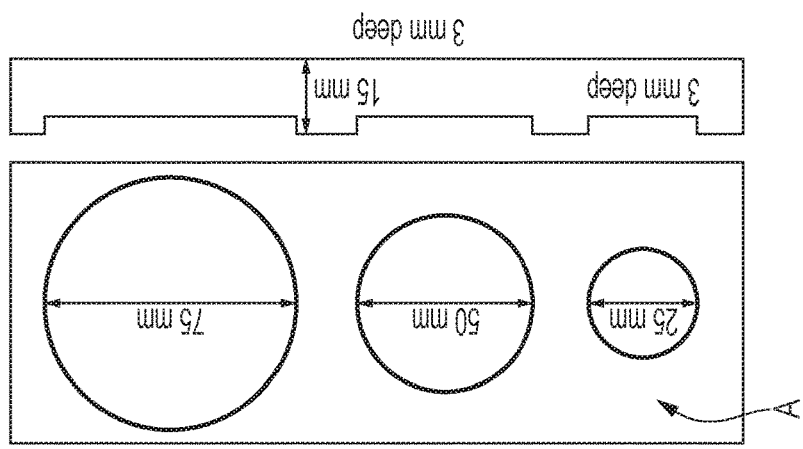

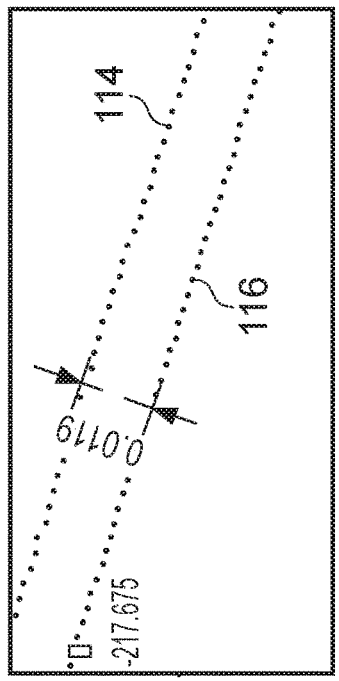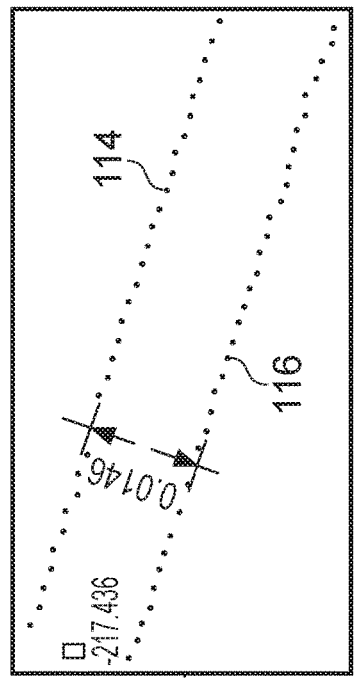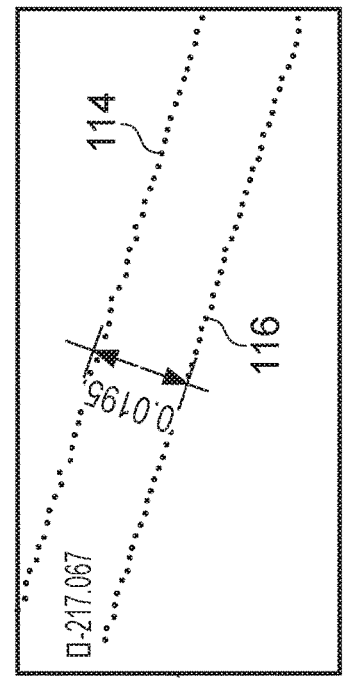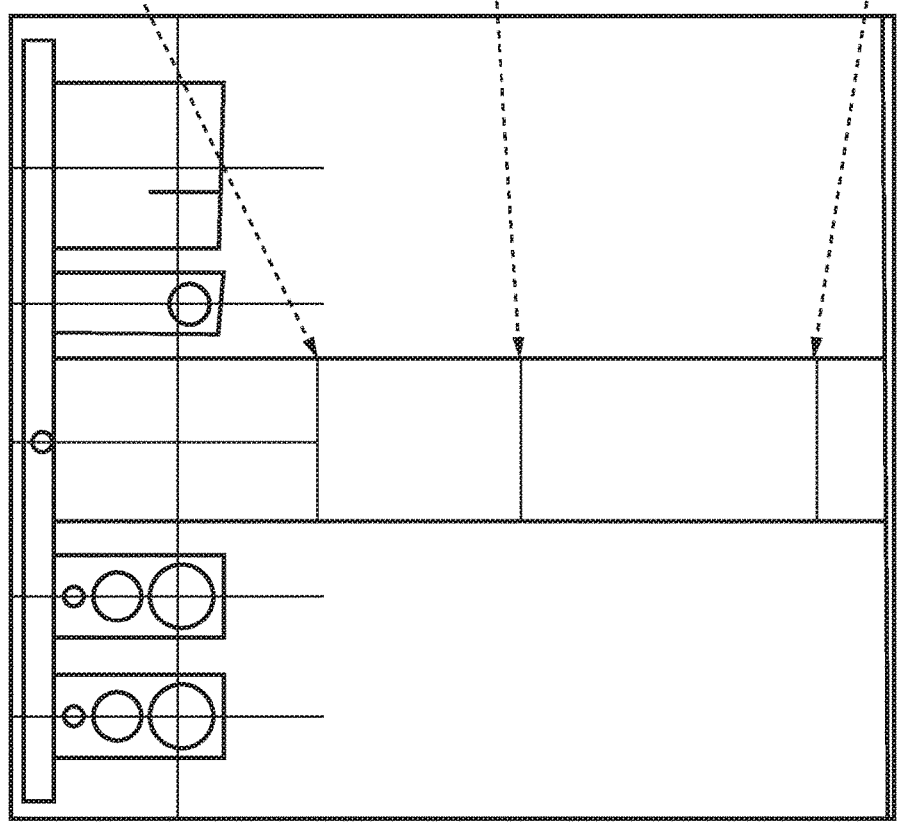

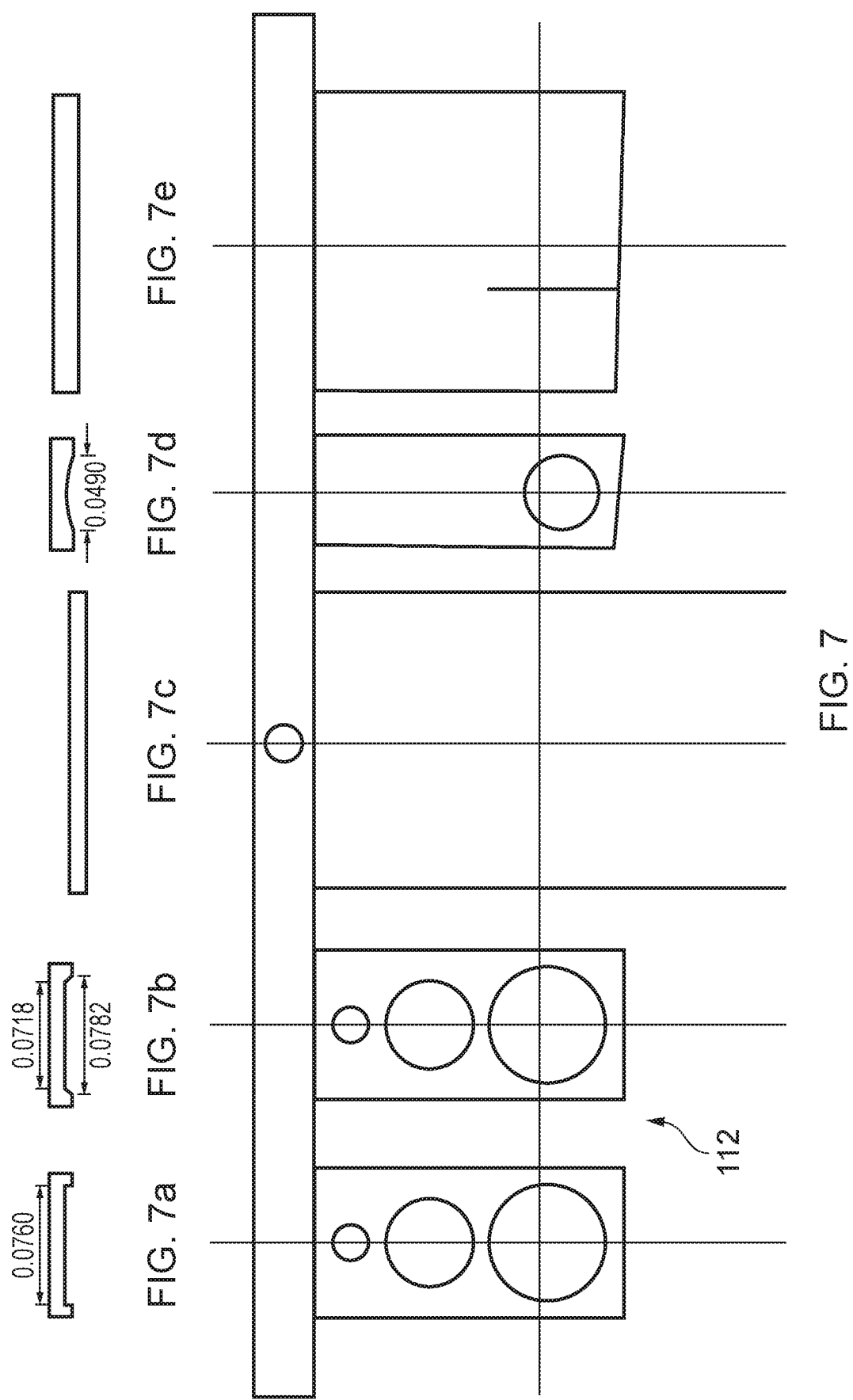

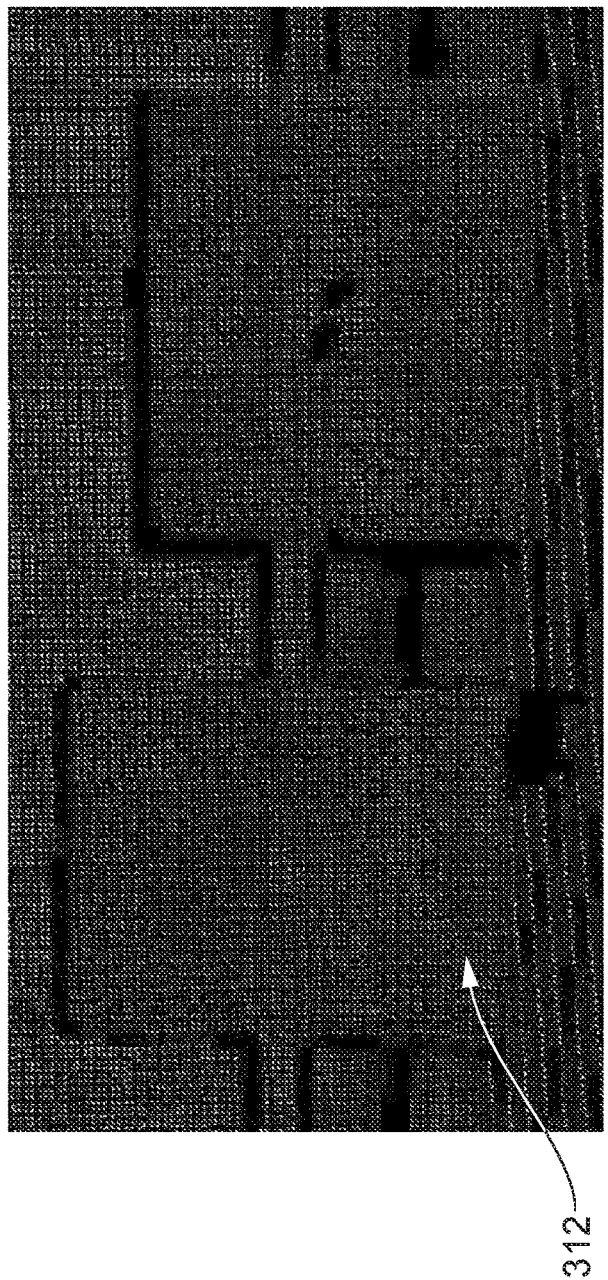
FIG. 18a
FIG. 18b
FIG. 19a
FIG. 19b

INSPECTION METHOD AND ASSOCIATED COMPUTER SOFTWARE

The present invention relates to a method of inspecting a vessel, particularly, but not exclusively, an inside thereof; and associated apparatus.

BACKGROUND

The Oil/Gas and indeed many other industries are concerned with the safety risks involved in people entering confined spaces. Additional risks are encountered when the confined space involves working at height, for example in a large storage tank or on a ship or offshore production facility.

However, at least some situations require personnel entry into such confined spaces. For example, industries, such as Oil/Gas, stipulate a regulatory and classification requirement to inspect these confined spaces at regular intervals to assure the integrity of the structure. Such inspections involve having a competent person carry out a General Visual Inspection (GVI) and a Close Visual Inspection (CVI) of critical parts of the structure and an assessment of any structural deformation by various visual and/or mechanical means.

These inspections are normally carried out by making the tank safe for man entry, cleaning the surfaces to be inspected to a given standard and providing safe access and egress to the components that require inspection. This requires considerable time, cost and renders the tank unavailable for use.

Where the structure shows signs of corrosion then there may be a further requirement to measure the remaining thickness of the steel to confirm the structural and leak integrity of the component or tank respectively.

Regulators and classification societies have prescribed that any inspection methods must provide a particular quality and scope of inspection to provide a GVI, CVI, structural deformation survey and wall thickness measurement of critical components where there is evidence of corrosion.

Previously, the present inventor has attempted to improve inspection, such as disclosed in WO2017/191447, the contents of which are incorporated herein.

It may be an object of one or more aspects, examples, embodiments, or claims of the present disclosure to at least mitigate or ameliorate one or more problems associated with the prior art.

SUMMARY

According to an aspect of the invention, there is provided a method of inspecting a vessel. The method may include any and all of the following steps:
  obtaining a first data set associated with a first surface of at least a portion of the vessel,
  obtaining the first data with laser scanning;
  generating a model or simulation indicative of the first surface in dependence on the obtained first data set; and
  determining a property of the portion of the vessel in dependence on the generated model or simulation.

The method may comprise a remote inspection method. The method may comprise an unmanned inspection method. The method may comprise inspecting an inside or interior of the vessel. The method may comprise inspecting an entirety of the inside of the vessel.

The method may comprise obtaining a second data set associated with a second surface of the vessel. The second data set may be obtained with laser scanning. The second surface may be a second surface of the portion of the vessel. The first surface may be associated with a first side of the vessel. The second surface may be associated with a second side of the portion of the vessel. The second surface may comprise an opposite surface of the portion of the vessel from the first surface. The second surface may be separated from the first surface by the portion of the vessel therebetween, such as a thickness of the portion of the vessel. For example, the first surface may comprise an inside of the portion of the vessel; and the second surface may comprise an outside of the portion of the vessel. The method may comprise a double-sided scanning. The data sets may correspond to a topography of the surface. The data sets may comprise a topographical model or map.

The property of the portion of the vessel may comprise a thickness of the portion of the vessel. The property of the portion of the vessel may comprise a cross-sectional property of the portion of the vessel. The property may comprise a plurality of thicknesses and/or cross-sectional properties of the portion of the vessel. The method may comprise determining the thickness of the portion of the vessel at a plurality of locations, such as along one or more axis/es. The/each axis may extend in a direction along or parallel to the first and/or second surface/s. A pair of axes may extend in perpendicular directions relative to each other, such as with a first axis in a first direction parallel to the first surface and a second axis in a second direction parallel to the first surface, the first and second axes being transvers to each other (e.g. "x" and "y" or similar). The cross-sectional property may comprise a profile. The method may comprise determining the cross-sectional property at any location of the portion of the vessel and/or along any axis relative to the portion of the vessel. The location or axis of the cross-sectional property may be predetermined and/or may be selectable, such as selectable in a post-scanning step.

The method may comprise determining the thickness of the portion of the vessel at a selected location. The method may comprise determining the thickness of the portion of the vessel at a location selectable following obtainment of the data set/s. The method may comprise determining the thickness of the portion of the vessel at any location of the portion of the vessel. For example, the method may comprise determining the thickness of the portion of the vessel at any location of the first surface. The/each data set may comprise a plurality of data points, each data point corresponding to a point on the first or second surfaces as appropriate. The first data set may comprise a plurality of data points, each data point corresponding to a location on the first surface. The/each data set may be representative of points on a corresponding surface of the vessel. The data points of the/each data set may correspond to a position on the corresponding surface of the portion of the vessel. The/each data set may comprise a data point cloud, such as a 2D or 3D point cloud. Each data point may represent the position on the corresponding surface of the portion of the vessel, such as with a geometric or volumetric positioning system (e.g. "x, y, z" coordinate system, and/or a vector positioning system, or the like).

The method may comprise combining at least the first data set and the second data set, such as to form a combined data set. The combined data set may position the first data set relative to the second data set. The method may comprise mapping the first data set relative to the second data set. The method may comprise mapping the first data set onto the data set so as to provide the model or simulation of the portion of the vessel. The method may comprise mapping the first data set relative to the second data set to position a model or simulation of the first surface relative to a model or simulation of the second surface.

The method may comprise aligning one or more data points from each data set. For example, the method may comprise aligning a plurality of data points from the first data set with a plurality of data points from the second data set. The data point/s for alignment may be indicative of a reference. The reference may be a common reference, such as common to each scan or data set. The method may comprise scanning the reference. For example, the method may comprise scanning a corresponding surface or feature with each obtainment of data points. The reference may comprise a fixed or known reference. For example, the reference may comprise a predetermined feature, the predetermined feature being identifiable in each data set. The method may comprise scanning the reference with or during the obtainment of the data set/s. The method may comprise scanning the reference with each scan and/or each scanner. In at least some examples, the reference may comprise at least one known property or dimension. For example, the reference may comprise a fixed or measured dimension, such as a thickness.

There may be a plurality of references. There may be a plurality of references associated with each data set.

The reference may be fixed or known relative to the portion of the vessel. In at least some examples, at least one reference may comprise a feature of the portion of the vessel. At least one reference may comprise a portable reference. The portable reference may be fixable to the portion of the vessel. Accordingly, the method may comprise fixing the reference relative to the portion of the vessel at a reference location and obtaining the first and second data sets with the reference at the reference location. The reference may comprise a global marker. The reference may comprise an identifier, such as an identifiable geometry when scanned. The reference may provide an indication of the reference location and optionally an indication of a reference direction or axis relative thereto. For example, the reference may comprise an asymmetry indicative of a vector in at least one direction. The method may comprise aligning the reference locations, and optionally the reference directions or axes, of the respective first and second data sets of any or all references common to the first and second data sets.

The reference may be scannable from each of the scanning locations to be associated with the reference. The reference may be scannable from inside and outside the vessel. For example, the reference may be scannable through an aperture or opening in the vessel. The reference may be located inside or outside the vessel. The reference location may be scannable from each of the scanning locations to be associated with the reference. The reference location may be scannable from inside and outside the vessel. For example, the reference location may be scannable through an aperture or opening in the vessel. The reference location may be located inside or outside the vessel. In at least some examples, a first reference is located inside the vessel and a second reference is located outside the vessel.

The method may comprise a sequential obtainment of the first and second data sets. The second data set may be obtained using a same scanner as the first data set. The first and second data sets may be obtained non-contemporaneously, such as with the second data set being obtained before or after the first data set.

Additionally, or alternatively, the method may comprise a non-sequential obtainment of the first and second data sets. The first and second data sets may be obtained with different scanners, such as with a first scanner and a second scanner respectively. The first and second data sets may be obtained contemporaneously. For example, the method may comprise obtaining the first and second data sets simultaneously, such as simultaneously with the first and second scanners.

The method may comprise including a temporal parameter/s in the data set or at least associating the temporal parameter/s with the data set. The temporal parameter/s may be indicative of when the data points of a data set/s is/was obtained. The temporal parameter may comprise a time or timing associated with the/each data point. The method may comprise associating the temporal parameter with the data points. In at least some examples, the method comprises associating a temporal parameter with each data point. Accordingly, each data point may be indicative of a 4-dimensional property or measurement, such as comprising a 3-dimensional position and a time associated with that 3-dimensional position.

The method may comprise synchronising two or more scanners. For example, the method may comprise scanning the first and second surfaces with the respective first and second scanners concurrently such that each of the first and second data sets comprises at least overlapping temporal parameters. The temporal parameter/s may be indicative of the timing of obtainment of data points of the first data set relative to the timing of the obtainment of data points of the second data set. The temporal parameter/s may enable a determination of a sequence of at least two data points of a/each data set. The method may comprise determining a timing of the obtainment of each data point. The method may comprise comparing the timing of the obtainment of data points. The method may comprise comparing the timing of the obtainment of at least some data points of the first data set with the timing of the obtainment of at least some data points of the second data set. The method may comprise comparing the temporal parameter of at least one data point from the first data set with the temporal parameter of at least one data point from the second data set. The method may comprise comparing, and optionally aligning, the temporal parameter of the reference in the first data set with the reference in the second data set.

The method may comprise generating the model or simulation and/or determining the property of the portion of the vessel subsequent to completion of the obtainment of the first and/or second data sets. For example, generating the model or simulation and/or determining the property of the portion of the vessel may comprise a post-processing step/s, such as performed at any juncture after completion of the obtainment of the data sets. Alternatively, at least partially generating the model or simulation and/or determining the property of the portion of the vessel may at least commence prior to completion of the obtainment of the first and/or second data sets.

The method may comprise on-site generation of the model or simulation and/or determination of the property of the portion of the vessel. Alternatively, the method may comprise off-site generation of the model or simulation and/or determination of the property of the portion of the vessel.

The method may comprise a retrospective generation of the model or simulation and/or determination of the property of the portion of the vessel, such as after completion of the scan/s. Alternatively, the method may comprise a contemporaneous generation of the model or simulation and/or determination of the property of the portion of the vessel, such as prior to completion of the scan/s. The contemporaneous generation of the model or simulation and/or determination of the property of the portion of the vessel may be real-time or live, or at least with a lag or delay less than a duration of at least one complete scan.

The method may comprise providing a visual representation of the data set/s. The model or simulation may comprise the visual representation. The visual representation may comprise a scaled or scalable model of the vessel, or portion thereof. The method may comprise providing an analysable visual representation of the vessel, or portion thereof. The visual representation may comprise a reproduction. The visual representation may comprise a virtual representation, such as conveyable by a screen or the like. The visual representation may be or may be comparable to a CAD representation. The method may comprise manipulating the visual representation. The method may comprise a user-controlled manipulation of the visual representation. The data set may be a point cloud, such that the visual representation may be a point cloud representation. The method may include the step of manipulating the point cloud representation so that a point of view of the point cloud representation is in a position and/or is moved to a position where, the vessel can be assessed and/or viewed for being one or more of straight, plumb, square and/or free from structural deformation.

The method may comprise an obtainment of a plurality of data sets. The plurality of data sets may be associated with a same portion of the vessel. For example, the method may comprise obtaining the first, second and a third data set. At least two of the data sets may overlap. For example, at least two of the data sets may be obtained by scanning surfaces or areas that overlap. The overlapping data sets may be obtained from different respective scanning locations. A scanning location may comprise a position of the scanner during scanning and may be considered as an origin for the corresponding data set. The method may comprise obtaining a plurality of data sets from a plurality of scanning locations or origins. The scanning locations or origins may be positioned to mitigate or eliminate shadow effects, such as may be associated with the vessel or portion/s thereof. For example, two scanning locations or origins may be located on opposite sides of a feature, such as an internal vessel wall or stiffener. Additionally, or alternatively a single scanning location may be selected to mitigate or eliminate shadow effects.

The method may comprise adapting or varying a rate and/or a resolution of scanning, such as in dependence on the vessel, or portion thereof, to be inspected. The method may comprise configuring the rate and/or the resolution of scanning to suit the vessel, or portion thereof. The method may comprise adapting or varying the rate and/or the resolution of scanning of the first scanner in dependence on the rate and/or the resolution of scanning of the second scanner. The method may comprise adapting or varying the rate and/or resolution of scanning in dependence on a parameter of the vessel. The vessel parameter may comprise a measured or monitored parameter. The vessel parameter may comprise a dynamic vessel parameter, such as a movement and/or vibration of at least a portion of the vessel. The vessel parameter may comprise a noise parameter, such as indicated by a feedback or blurring of obtained data, such as a variation above a threshold at at least one obtained data point or a cluster of obtained data points.

The method may comprise determining a surface property of the first surface in dependence on the obtained first data set. The method may comprise a single-sided scanning.

The surface property may comprise a thickness or depth property of the first surface. For example, the property may comprise a depth of a pit, recess, depression, opening or the like in the first surface. The thickness or depth property may comprise a maximum thickness or depth. For example, the maximum depth property, may comprise a maximum defect depth (e.g. maximum pit depth). The method may comprise scanning the first surface for a defect/s, such as for the detection and/or measurement of a defect/s. The method may comprise scanning the surface from a scanning location within a maximum separation from the surface. The method may comprise scanning the surface from a scanning location with a minimum separation from the surface. The maximum separation may be selected from: 1 m, 2 m, 3 m, 5 m, 10 m, 15 m. The minimum separation may be selected from 0.1 m, 0.2 m, 0.5 m, 1 m, 2 m. The separation of the scanning location or origin from the surface may be selected in dependence on the vessel portion and/or desired resolution or accuracy of the model or simulation.

The method may comprise measuring a nominal wall thickness of the portion of the vessel. By measuring the nominal wall thickness, a remaining wall thickness can be calculated by subtracting the depth property. For example, the method may comprise calculating a remaining wall thickness by subtracting the maximum defect depth from the nominal wall thickness. Based on the remaining wall thickness, the lifespan of the vessel can be determined.

The method may comprise scanning a plurality of surfaces with each scan. The method may comprise scanning a layer. The method may comprise scanning through a layer. The method may comprise scanning through an upper surface to obtain a data point corresponding to a lower surface below or behind the upper surface. The layer may be associated with a coating or substance. The upper layer may be associated with the coating or substance. The coating or substance may comprise a liquid and/or a solid. For example, the coating or substance may comprise a sludge or residue or other deposit, such as associated with a substance contained or previously-contained in the vessel. In at least some examples, the scanner/s may be configured to scan through the layer, such as to only obtain data points corresponding to the surface of the portion of the vessel, such as an uncoated or base surface of the portion of the vessel.

The method may comprise configuring the scanner/s, such as to be reflected, only reflected or primarily reflected by a target surface or target surface type.

It may be an advantage of the present invention that the method of inspecting the vessel is in a manner and/or quality and/or resolution at least equivalent to that required by regulation. The manner and/or quality and/or resolution may be at least equivalent to that obtainable by ultrasonic thickness measurement, or at least comparable thereto. It may be an advantage of the present invention that the method of inspecting the vessel is in a manner and/or quality and/or resolution at least equivalent to that which a skilled surveyor or engineer would achieve if they had access to all parts of the vessel including within 'arm's length' of components, such as subject to a Close Visual Inspection, in particular if the skilled surveyor or engineer were inside the vessel and had such access.

Inspecting the vessel may comprise inspecting an inside of the vessel. The method may comprise inspecting the vessel without a person entering or being required to enter the vessel. The method may comprise the entry of only apparatus, such as scanning apparatus, into the vessel.

The steps of the method may be in any order. The inside of the vessel may be referred to as a confined space. The method of inspecting the inside of the vessel may be referred to as a method of inspection.

It may be an advantage of the present invention that the method of inspection is equivalent or at least substantially equivalent, such as in quality and/or scope, to the inspection that a competent person would achieve if they entered the vessel.

The method may comprise obtaining a visual image of the inside of the vessel using a camera, such as typically for a General Visual Inspection (GVI) and/or Close Visual Inspection (CVI) of the inside of the vessel. For example, the method may additionally comprise any of the steps as described in Applicant's earlier disclosure, WO2017/191447.

The method may include the step of positioning and/or locating the scanner/s at different levels inside and/or from a particular access point and/or from different access points into the vessel. The scanner/s may be mounted and/or attached to a pole such as similar to for a camera.

The scanner/s may be capable of operating in extreme conditions, including toxic gases, high levels of heat and humidity. The scanner/s may be operable in and/or under water. The scanner/s may be referred to as watertight. In use the vessel may be dry or fully or partially filled with fluid, typically water.

The scanner/s may be stabilised, that is the scanner/s may be releasably attached to the vessel. Additionally, or alternatively, the method may include the step of using the plurality of scanners to obtain a plurality of simultaneous data sets. It may be an advantage of the present invention that obtaining a plurality of data sets, particularly simultaneously, mitigates any movement of the vessel, such that movement of the vessel does not substantially affect the overall quality of the data sets obtained. During the method of inspecting the inside of the vessel, the vessel may move. The vessel may be on or part of a moving ship or Floating Production, Storage and Offloading unit (FPSO) or Mobile Offshore Drilling Unit or Accommodation Vessel for example. The method may comprise a short-range inspection. The vessel may comprise a container, such as for containing a material, fluid, or the like.

The vessel may be referred to as a confined space. The vessel may be tens of meters in one or more of length, depth and height. The vessel may be a tank on and/or part of a ship. The ship may be a drillship or a cargo ship. The tank may be a ballast and/or water ballast tank. The tank may be a fuel and/or oil tank. The tank may be a J-tank.

The vessel may be on or part of a Floating Production, Storage and Offloading unit (FPSO). The vessel may be a pressure vessel.

The one or more objects inside the vessel may be one or more parts of the vessel or one or more components inside the vessel. The one or more surfaces of the inside of the vessel are typically one or more of the inside walls of the vessel.

The scanner/s may be configured to scan one or more objects with an accuracy of normally ±0.5 mm, typically ±0.1 mm. The accuracy may be referred to as high accuracy. The scanner may produce data which can then be replicated to a high accuracy.

The method may include the step of using the data to produce a model of the object using a 3D printer.

It may be an advantage of the present invention that the method of inspecting the inside of the vessel has one or more of enhanced safety, reduced cost in preparation and/or inspection and is a faster method of inspecting a vessel which may increase system availability, require fewer personnel and reduce downtime compared to conventional inspection methods.

The method may further include a structural assessment of the vessel by a competent person and/or engineer before and/or during and/or after the steps of obtaining the data set/s. The structural assessment will normally identify one or more of the probable deterioration, structural deformation, thickness gauging requirements, anomalies, work scope, defect tolerance standards and reporting standards for and/or in the vessel. The method may include the step of using an ultrasonic scanner and/or non-immersion ultrasonic scanner to measure the thickness of a wall or walls of the vessel. The method may comprise replacing at least a portion of another thickness gauging process and/or apparatus with the scanning as described herein. For example, the method may comprise replacing at least some ultrasonic thickness gauging, such as otherwise may be employed, with scanning, particularly laser scanning. The method may comprise only performing an ultrasonic scan as a calibration step, such as for obtaining the reference/s for the data sets and/or calibrating the laser scanner/s.

The structural assessment of the vessel by a competent person and/or engineer may also include assessing where the scanner/s will be inserted into the vessel. The scanner/s is/are typically inserted into the vessel through an aperture and/or hole in the vessel. The aperture and/or hole may already exist and may be a man entry hatch, butterworth hatch or inspection port.

The method may include the step of preparing the aperture and/or hole so that a fluid and/or gas tight seal can be formed during the inspection of the inside of the vessel (e.g. between a mounting apparatus, such as a pole or the like, for the scanner and the aperture). It may be an advantage of the present invention that the fluid and/or gas tight seal minimises the need to one or more of clean, vent or empty the vessel during the inspection of the inside of the vessel. This may reduce the overall cost of the method of inspecting the inside of the vessel.

The method may further include filling or at least partially filling the vessel with a liquid, typically water. This may be particularly useful when the vessel has an internal shape such that the scanner/s cannot gain access to and or see all of the inside of the vessel, one or more objects inside of the vessel or one or more surfaces of the inside of the vessel respectively. The method may then further include mounting and/or attaching the scanner/s to a Remotely Operated Vehicle (ROV).

According to an aspect of this invention, there is provided an apparatus configured to perform a method according to an aspect, claim, embodiment or example of this disclosure.

According to an aspect of the invention, there is provided a controller arranged to perform a method according to an aspect, claim, embodiment or example of this disclosure.

According to an aspect of the invention, there is provided a system comprising a controller according to an aspect, claim, embodiment or example of this disclosure, or a system arranged to perform a method according to an aspect, claim, embodiment or example of this disclosure.

According to an aspect of the invention, there is provided computer software which, when executed by a processing means, is arranged to perform a method according to aspect, claim, embodiment or example of this disclosure. The computer software may be stored on a computer readable medium. The computer software may be tangibly stored on a computer readable medium. The computer readable medium may be non-transitory.

Any controller or controllers described herein may suitably comprise a control unit or computational device having one or more electronic processors. Thus, the system may comprise a single control unit or electronic controller or alternatively different functions of the controller may be embodied in, or hosted in, different control units or controllers. As used herein the term "controller" or "control unit" will be understood to include both a single control unit or controller and a plurality of control units or controllers collectively operating to provide any stated control functionality. To configure a controller, a suitable set of instructions may be provided which, when executed, cause said control unit or computational device to implement the control techniques specified herein. The set of instructions may suitably be embedded in said one or more electronic processors. Alternatively, the set of instructions may be provided as software saved on one or more memory associated with said controller to be executed on said computational device. A first controller may be implemented in software run on one or more processors. One or more other controllers may be implemented in software run on one or more processors, optionally the same one or more processors as the first controller. Other suitable arrangements may also be used.

Within the scope of this disclosure it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION

An embodiment of the invention will now be described by way of example only and with reference to the accompanying drawings, in which:

FIG. 1 shows a schematic representation of a sample object, indicative of target dimensions to be measured by inspection;

FIG. 2 shows a representation of a portion of the sample object of FIG. 1 with data sets obtained by laser scanning the sample object of FIG. 1;

FIG. 2a shows a detail of FIG. 2;

FIG. 4 shows a schematic representation of a further sample object, with FIGS. 4a, 4b, 4c, and 4d respectively showing portions of plates A, B, C and D respectively forming part of the further sample object;

FIG. 5 shows a front view of a model with data sets obtained by laser scanning the sample object of FIG. 4, indicating positions of cross-sections through the model, with the respective horizontal cross-sections of plate C represented in detailed views 5a, 5b and 5c respectively;

FIG. 7 shows a further plan view similar to that of FIG. 5, with horizontal cross-sections, along the horizontal lines shown in FIG. 7, with FIGS. 7a, 7b, 7c, 7d and 7e showing respective horizontal cross-sections through plates A, B, C, D and E respectively;

FIGS. 12a and 12b show detailed views of thicknesses of stiffener walls obtained from the vertical cross-section of FIG. 11a;

FIG. 18 shows a representation generation by a further single-sided scan, with the first and second examples of FIGS. 15a and 15b shown in FIGS. 18a and 18b respectively;

FIGS. 19a and 19b show dimensions derived from the scans shown in FIGS. 18a and 18b respectively;

DETAILED DESCRIPTION

Figures 3, 8, 14:
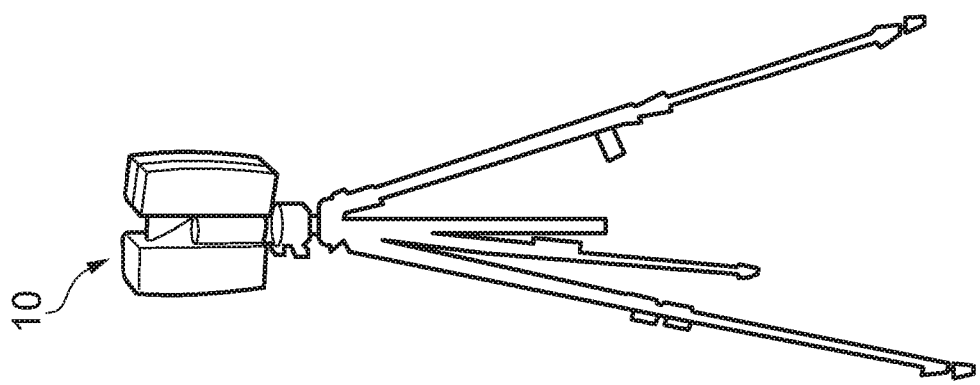
FIG. 3 shows an example scanning arrangement.
FIG. 8 shows a table summarising thickness measurements obtained from the model of FIG. 5.
FIG. 14 shows a table summarising thickness measurements obtained from the model of FIG. 9.
Figure 6E:
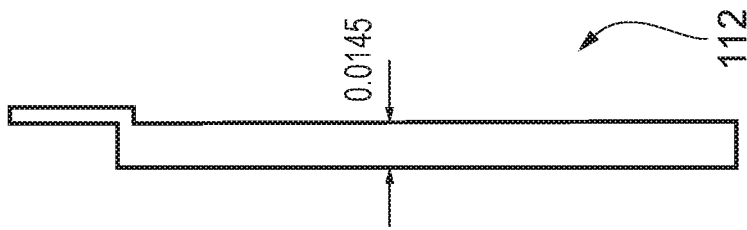
FIG. 6 shows vertical cross-sections, along the vertical lines shown in FIG. 5, with FIGS. 6a, 6b, 6c, 6d and 6e showing respective horizontal cross-sections through plates A, B, C, D and E respectively.
Figure 6D:
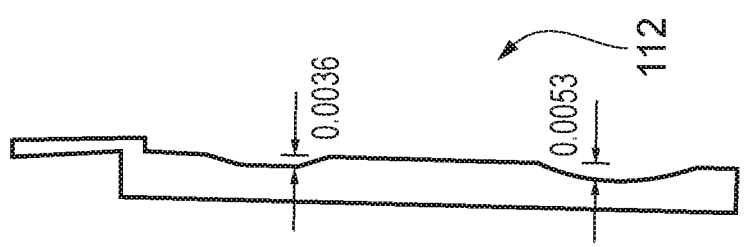
Figure 6C:
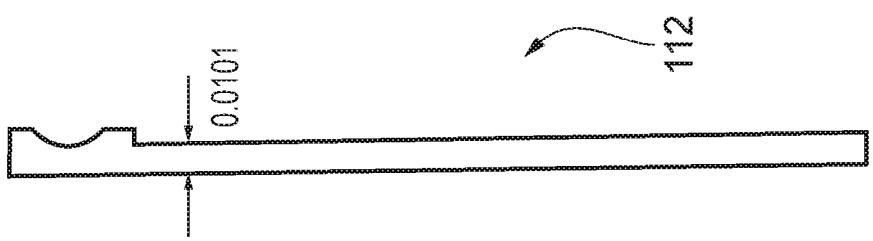
Figure 6B:
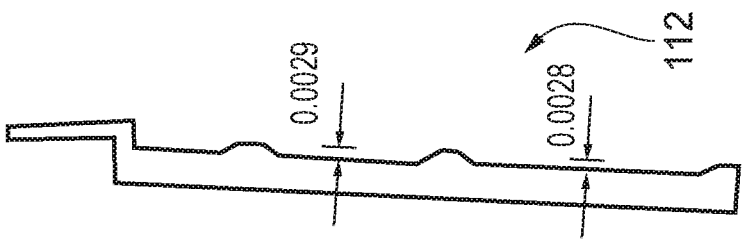
Figure 6A:
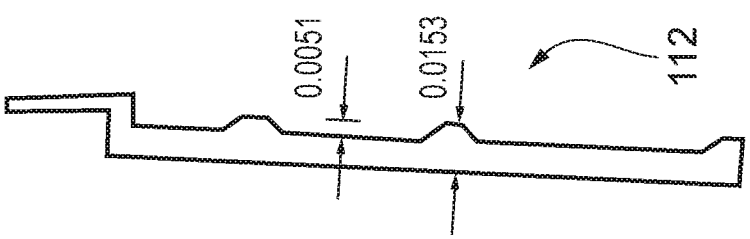

There is herein described a method of inspecting the inside of a vessel. The method including the steps of obtaining a first data set associated with a first surface of at least a portion of the vessel with laser scanning; generating a model or simulation indicative of the first surface in dependence on the obtained first data set; and determining a property of the portion of the vessel in dependence on the generated model or simulation.

Referring first to FIG. 1, there is shown a schematic representation of a sample object 10, in the form here of a structural beam, indicative of target dimensions to be measured by inspection. FIG. 2 shows a representation 12 of a portion of the sample object 10 of FIG. 1 with data sets 14, 16 obtained by laser scanning the sample object 10 of FIG. 1. Here, the sample object 10 was a structural beam. The method comprised scanning from one side of the object 10 from approximately 8 m and 45 degrees to obtain the first data set 14; then the scanner was repositioned on the other, opposite side of the object 10, again to scan from approximately 8 metres and 45 degrees to obtain the second data set 16. FIG. 2a shows a detail of FIG. 2, indicating the combination of the first and second data sets 14, 16 to allow determination of a thickness 18 of the sample object 10. Following post processing of the data from the structural beam scans, the scan data was sectioned through at a height of 1 m from the floor of the facility and displayed to show a 5 mm cut-section.

The thickness measurement 18, as shown in FIG. 2a, was then obtained for the web of the structural beam. As can be seen, the results indicate that the laser scanning provides a measurement of the beam thickness 18 to be 9 mm; which is less than that measured by the ultrasonic thickness gauge (11.1 mm).

FIG. 3 shows an example scanning arrangement 20, here comprising a FARO Focus X130 laser scanner on an adjustable tripod stand.

FIG. 4 shows a schematic representation of a further sample object 110, with FIGS. 4a, 4b, 4c, and 4d respectively showing portions of plates A, B, C and D respectively forming part of the further sample object 110. FIGS. 4a, 4b, and 4d show both plan or front views of the respective plates A, B, D and also cross-sections therethrough.

FIG. 5 shows a front view of a model 112 with data sets 114, 116 obtained by laser scanning the sample object 110 of FIG. 4, indicating positions of cross-sections through the model, with the respective horizontal cross-sections of plate C represented in detailed views 5a, 5b and 5c respectively. As the dimensions indicate in FIG. 4, the long middle plate C has varying thickness from 20 mm to 10 mm. The thickness of plate C is shown in FIGS. 5a, 5b an 5c respectively at three vertical levels in line with the plate being 12 mm, 15 mm and 20 mm thick. FIG. 5a corresponds to the 12 mm thickness plate C. FIG. 5b corresponds to the 15 mm thickness plate C. FIG. 5c corresponds to the 20 mm thickness plate C. As can be seen, all are within 0.5 mm accuracy.

Here, the data sets 114, 116 were obtained by respective pairs of scanning from each, opposite side of the object 110 (front and back): each data set 114, 116 comprising data points obtained by direct line scans from 5 m and 10 m respectively. For clarity, it should be noted that the various defect plates were not aligned within the assembly. Following post processing, the data were sectioned through vertically and horizontally on the defect assembly test piece 110.

FIG. 6 shows vertical cross-sections, along the vertical lines shown in FIG. 5, with FIGS. 6a, 6b, 6c, 6d and 6e showing respective horizontal cross-sections through plates A, B, C, D and E respectively. The results of plate A indicate 5.1 mm indent on plating 15.3 mm thick. The results of plate B indicate 2.9 mm and a 2.8 mm indent. The results of plate C indicate a thickness at the top end of the plate of 10.1 mm. The results of plate D indicate an indent of 3.6 mm in the upper portion of the plate and a 5.3 mm indent in the lower portion. The results of plate E (not shown in FIG. 4) indicate a plate thickness of 14.5 mm. The results from the horizontal cross section taken through plates A, B, C, D & E are shown in FIG. 7, with the horizontal cross-sections, along the horizontal lines shown in FIG. 7, with FIGS. 7a, 7b, 7c, 7d and 7e showing respective horizontal cross-sections through plates A, B, C, D and E respectively. The results of plate A indicate a flat-bottomed defect 76 mm wide. The results of plate B indicate a flat-bottomed defect 78.2 mm wide tapering down to 71.8 mm. The results of plate D indicate a curved defect 49 mm wide. FIG. 8 shows a table summarising thickness measurements obtained from the model of FIG. 5.

Figure 9:
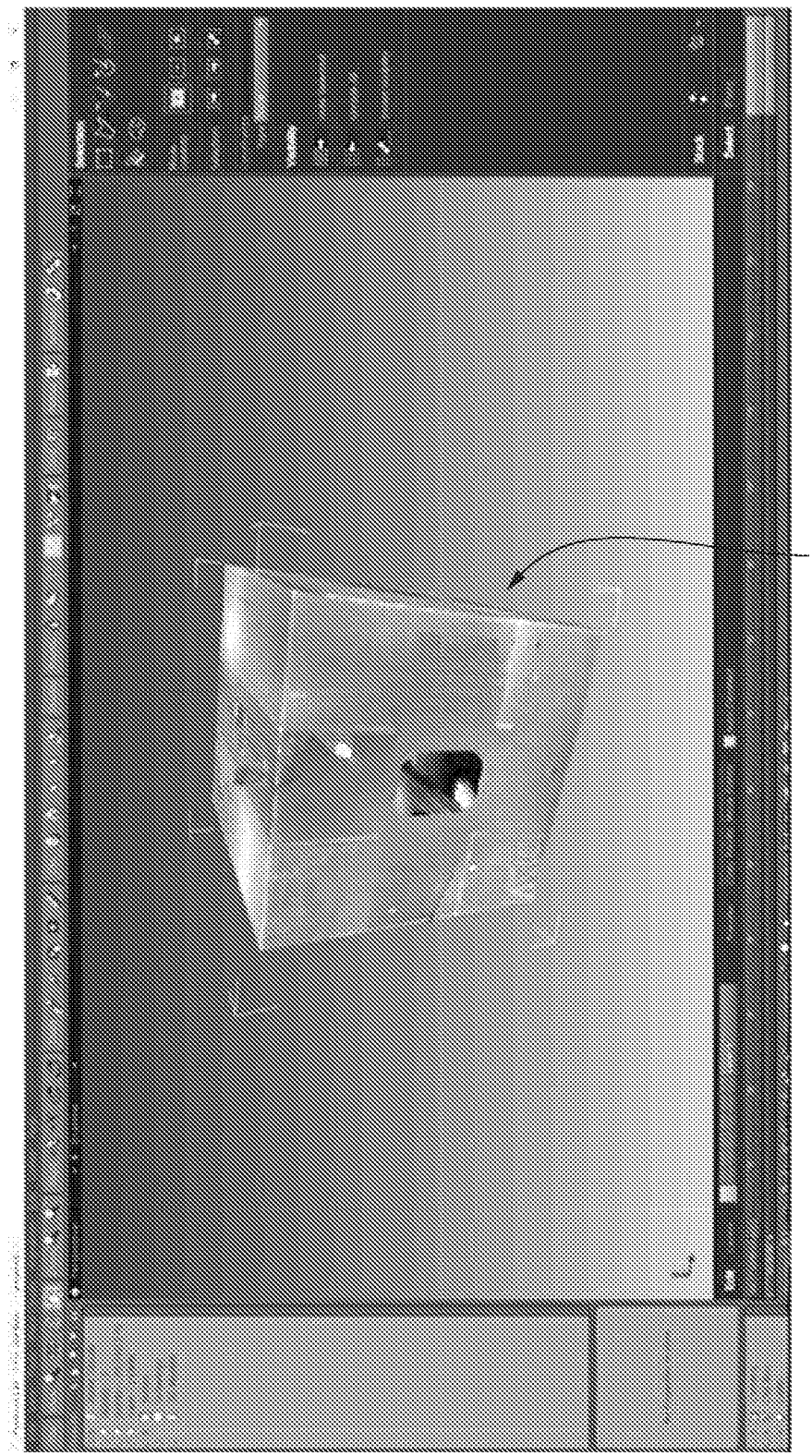
FIG. 9 shows a perspective view of a model with data sets obtained by laser scanning an example vessel, with the respective vertical and horizontal cross-sections of the mode represented in views 10a and 10b respectively.
Figure 10A:
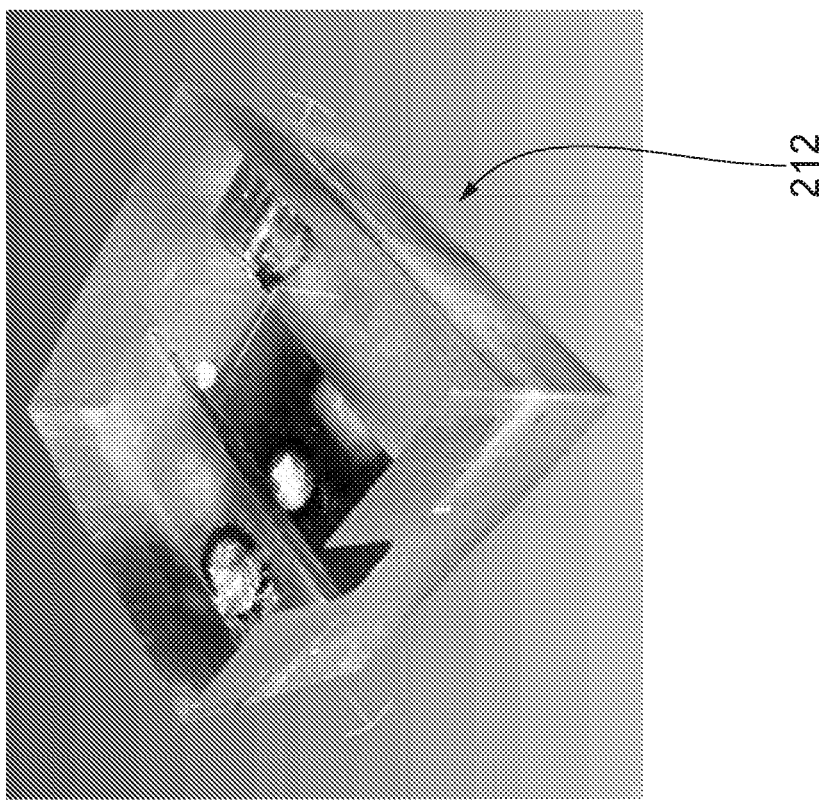
Figure 10B:
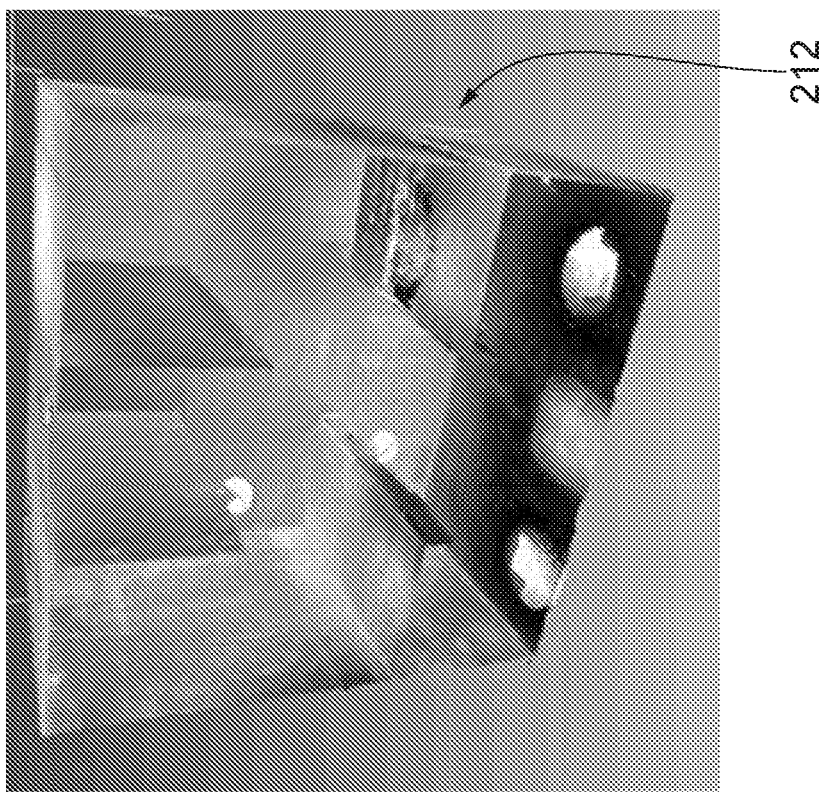
Figure 11B:
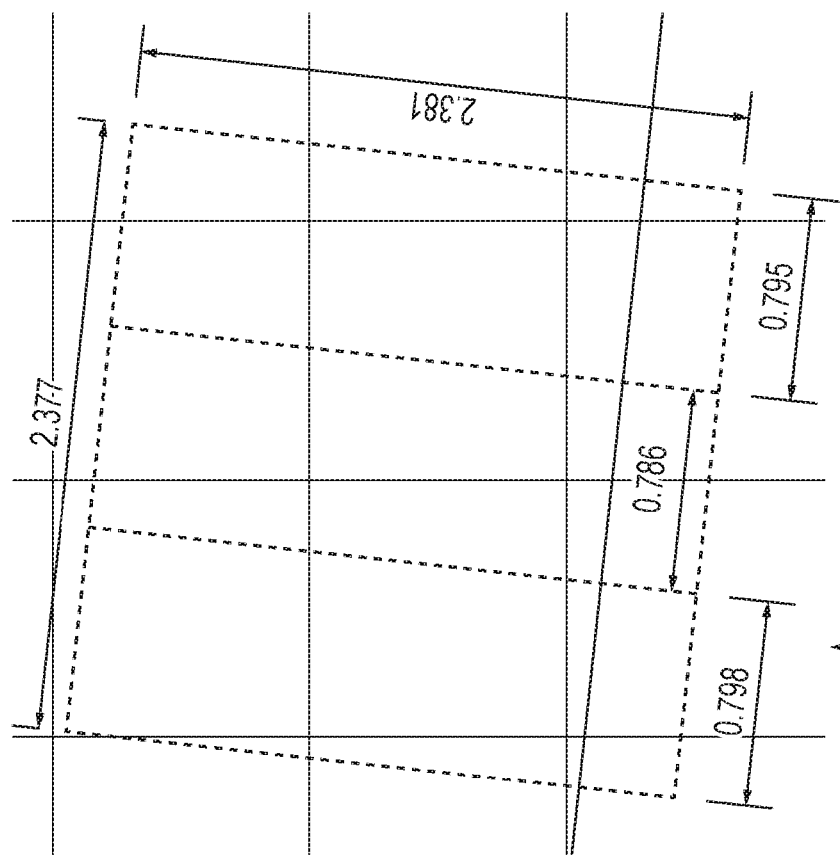
FIGS. 11a and 11b show dimensions of the vessel obtained from the cross-sections of FIGS. 10a and 10b respectively.
Figure 11A:
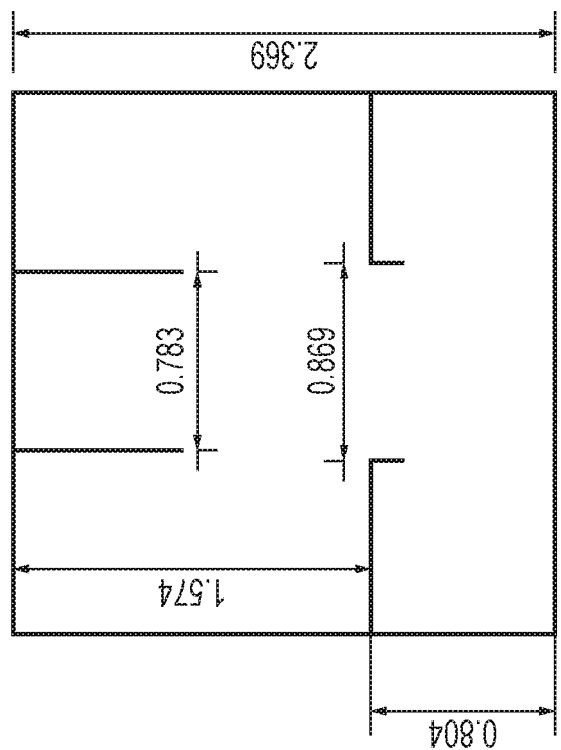
Figure 12B:
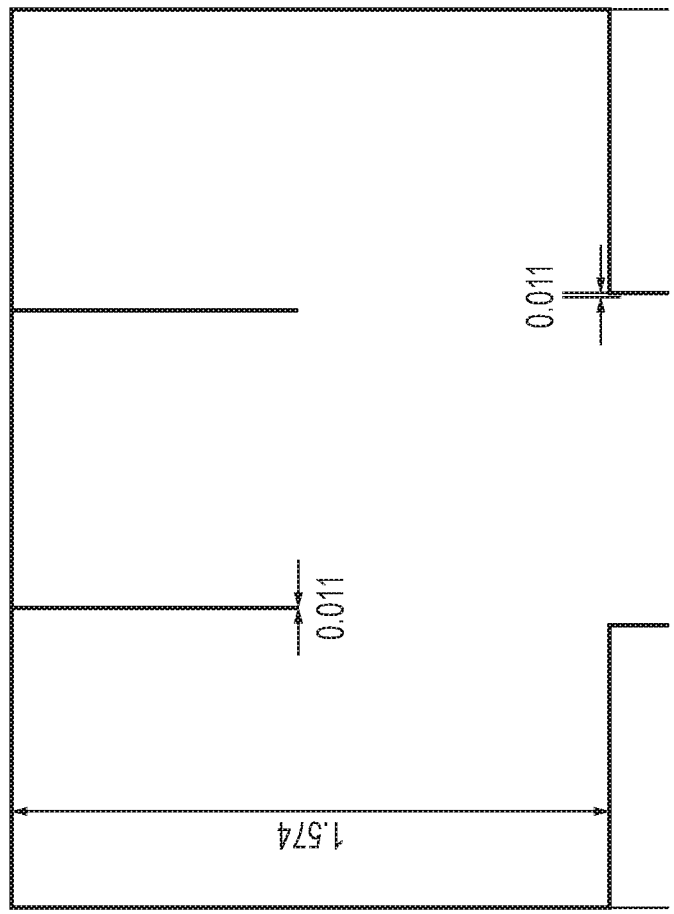
Figure 12A:
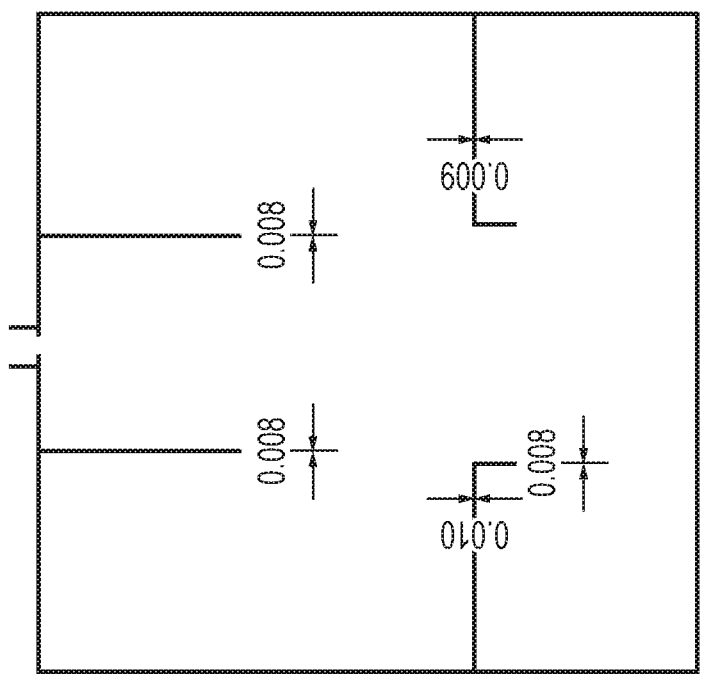
Figure 13:
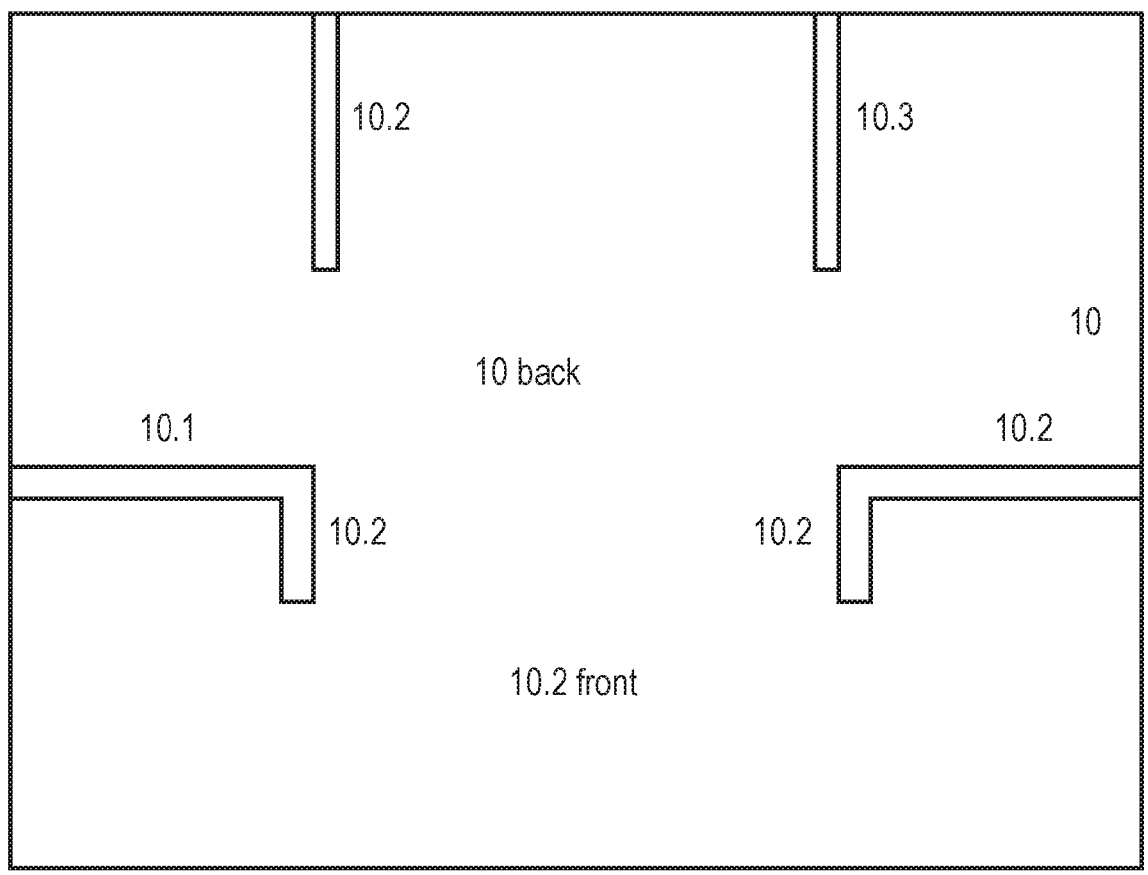
FIG. 13 shows a schematic view of the example vessel indicating actual thicknesses of the stiffener walls shown in FIGS. 12a and 12b.

FIG. 9 shows a perspective view of a model 212 with data sets obtained by laser scanning an example vessel 210, with the respective vertical and horizontal cross-sections of the mode represented in views 10a and 10b respectively. Here, the method has comprised scanning an outside of the test tank from three locations (not shown); and scanning an inside of the test tank with the laser scanner positioned in five locations (not shown) to ensure no shadow areas. Here, the method has comprised the sequential scanning to obtain the plurality of data sets, using a single scanner 20, the single scanner being repositioned to each of the respective scanning locations between scans. It will be appreciated that other methods comprise the simultaneous obtainment of at least some of the plurality of data sets, with a plurality of scanners 20. Here, the mapping of the data sets from the external and internal scans of the test tank allowed a complete 3-dimension model 212 of the tank to be created. The 3D model 212 allows cross-sections to be developed at any level, examples of which are shown in FIGS. 10a and 10b respectively. From this model 212, vertical and horizontal dimensions were extracted. FIGS. 11a and 11b show dimensions of the vessel obtained from the cross-sections of FIGS. 10a and 10b respectively. FIGS. 12a and 12b show detailed views of thicknesses of stiffener walls obtained from the vertical cross-section of FIG. 11a. From the laser scanning, the thicknesses attributed to the stiffeners varies from 8 to 11 mm. The actual thicknesses are known to be 10 mm. FIG. 13 shows a schematic view of the example vessel 210 indicating actual thicknesses of the stiffener walls shown in FIGS. 12a and 12b. FIG. 14 shows a table summarising thickness measurements obtained from the model of FIG. 9.

Figure 15A:
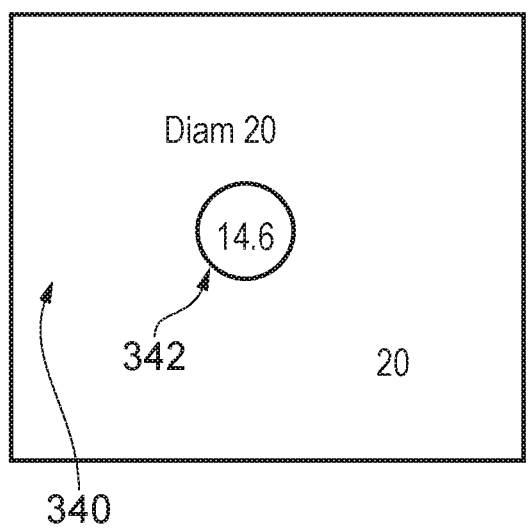
FIGS. 15a and 15b show schematic views of respective first and second example surfaces for single-sided scanning.
Figure 15B:
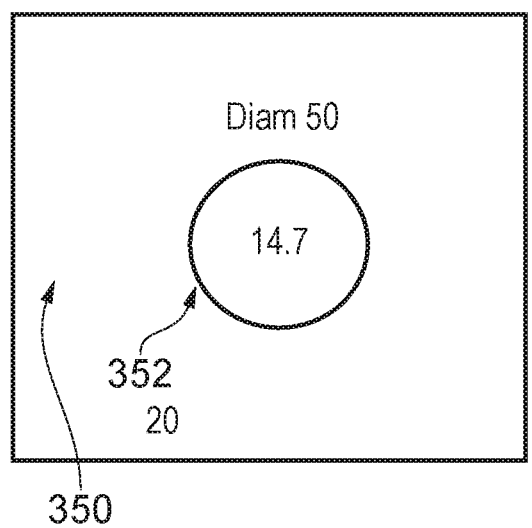

FIGS. 15a and 15b show schematic views of respective first and second example surfaces 340, 350 for single-sided scanning. In this example, the surfaces 340, 350 are defined by two corroded plates with simulated pits 342, 352 machined in them, which were scanned. The respective surfaces 340, 350 were single scanned close up, at a separation or distance of the scanner 20 from the surface 340, 350 of 2 m, and then at a distance of 10 m away. Accordingly, comparison can be made to test the difference in quality of each of the single scan's data capture. According to a method of this invention, topographical maps of the surfaces 340, 350 were then created in order to determine the thickness of the plates and the dimensions of the defects 342, 352. The two scans, from the respective separations of 2 m and 10 m, were not mapped together.

Figures 16A, 16B:
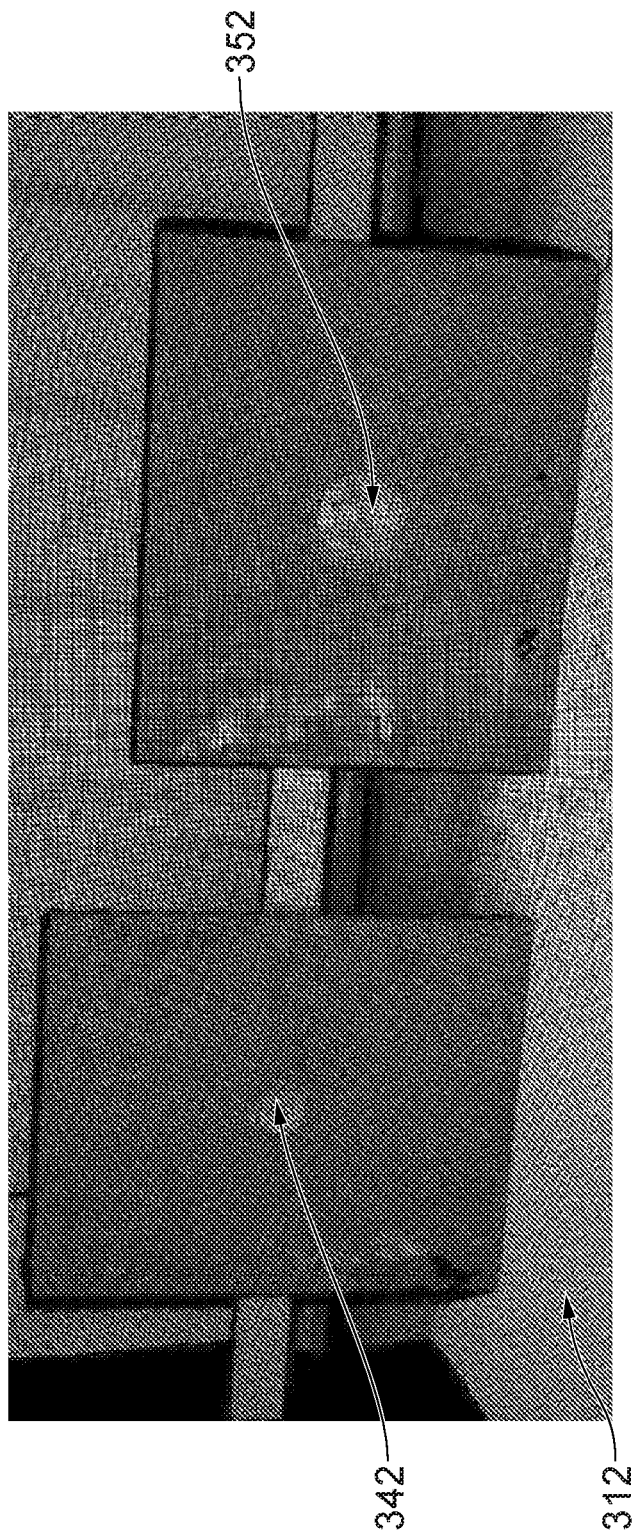
FIG. 16 shows a representation generation by a first single-sided scan, with the first and second examples of FIGS. 15a and 15b shown in FIGS. 16a and 16b respectively.
Figure 17B:
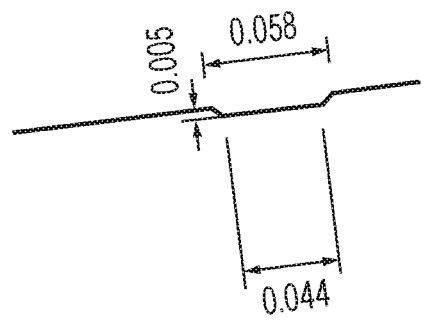
FIGS. 17a and 17b show dimensions derived from the scans shown in FIGS. 16a and 16b respectively.
Figure 17A:
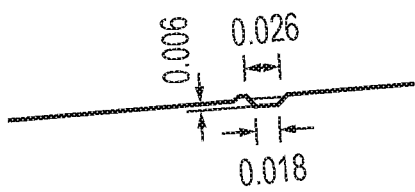

FIG. 16 shows a representation 312 generation by a first single-sided scan, at the 2 metere separation, with the first and second examples of FIGS. 15a and 15b shown in FIGS. 16a and 16b respectively. FIGS. 17a and 17b show dimensions derived from the scans shown in FIGS. 16a and 16b respectively. FIGS. 17a and 17b show portions of the point cloud topographical maps obtained from the scan from 2 m.

FIG. 18 shows a representation generation by a further single-sided scan, at the separation of 10 metres, with the first and second examples of FIGS. 15a and 15b shown in FIGS. 18a and 18b respectively. FIG. 19b shows dimensions derived from the scan shown in FIG. 18b. Although the defect could be detected in FIG. 19a, no dimensions could be taken due to insufficient detail in the scan data from 10 m for this defect. FIGS. 19a and 19b show portions of the point cloud topographical maps obtained from the scan from 10 m.

Figure 21:
FIG. 21 shows a visual image of the object of FIG. 15b.
Figure 20:
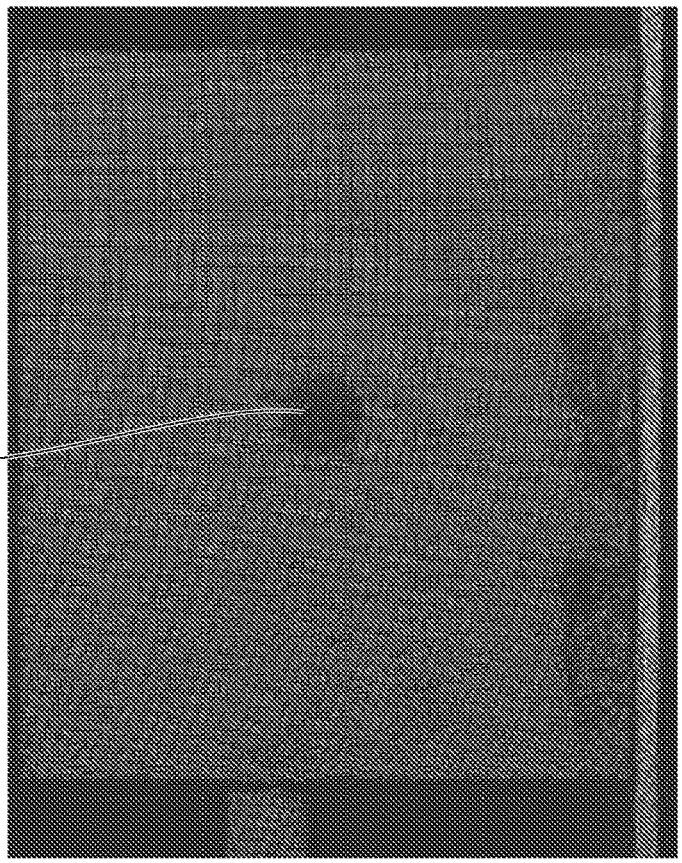
FIG. 20 shows a further representation of the single-sided scan of FIG. 16b.

FIG. 20 shows a further representation of the single-sided scan of FIG. 16b. Here, the data set obtained by the 2 m scan was further post processed to provide a planar shader set to 10 mm. FIG. 21 shows a visual image of the object of FIG. 15b. As can be seen in FIG. 20, the pit 352 of FIG. 21 is clearly visible. In fact, corrosion to the lower end of the plate is also identified.

In each of the examples here, the time for each scan to obtain each individual data set was approximately 8 minutes. However, it will be appreciated that the method may comprise adapting the rate and/or resolution of the scan/s. Accordingly, different scanning times are contemplated.

It will be appreciated that embodiments of the present invention can be realised in the form of hardware, software or a combination of hardware and software. Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape. It will be appreciated that the storage devices and storage media are embodiments of machine-readable storage that are suitable for storing a program or programs that, when executed, implement embodiments of the present invention. Accordingly, embodiments provide a program comprising code for implementing a system or method as disclosed in any aspect, example, claim or embodiment of this disclosure, and a machine-readable storage storing such a program. Still further, embodiments of the present disclosure may be conveyed electronically via any medium such as a communication signal carried over a wired or wireless connection and embodiments suitably encompass the same.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed. The claims should not be construed to cover merely the foregoing embodiments, but also any embodiments which fall within the scope of the claims.

The invention claimed is:

1. A method of inspecting a vessel, the method comprising:
    positioning a laser scanner relative to at least a portion of the vessel;
    laser scanning a first surface of the portion of the vessel to obtain a first data set associated with the first surface of the portion of the vessel;
    laser scanning a second surface of the portion of the vessel to obtain a second data set associated with the second surface of the portion of the vessel;
        wherein the first surface is associated with a first side of the portion of the vessel, and the second surface is associated with a second side of the portion of the vessel, the second surface being separated from the first surface by a thickness of the portion of the vessel therebetween;
        wherein the first surface comprises an inside of the portion of the vessel, and the second surface comprises an outside of the portion of the vessel, such that the method comprises a double-sided scanning;
    generating a model or simulation indicative of the first surface in dependence on the obtained first data set; and
    determining the thickness of the portion of the vessel in dependence on the generated model or simulation.

2. The method of claim 1, the method comprising a remote, unmanned inspection of the inside of the vessel.

3. The method of claim 1, wherein the method comprises determining the thickness of the portion of the vessel at a plurality of locations, such as to provide a cross-sectional profile of the portion of the vessel.

4. The method of claim 1, wherein the method comprises determining the thickness of the portion of the vessel at a location selectable following obtainment of the data sets.

5. The method of claim 1, wherein each data set comprises a plurality of data points, each data point of the respective data sets corresponding to a point on the respective first and second surfaces, each data point representing a position on the corresponding surface of the portion of the vessel with a volumetric positioning system, such that each data set comprises a data point cloud.

6. The method of claim 1, wherein the method comprises combining at least the first data set and the second data set to form a combined data set, the combined data set positioning the first data set relative to the second data set; wherein the method comprises mapping the first data set relative to the second data set so as to provide the model or simulation of the portion of the vessel.

7. The method of claim 1, the method comprising a sequential obtainment of the first and second data sets, the second data set being obtained using a same scanner as the first data set.

8. The method of claim 1, the method comprising a non-sequential obtainment of the first and second data sets, the first and second data sets being obtained with different scanners.

9. The method of claim 1, the method comprising generating the model or simulation and determining the property of the portion of the vessel subsequent to completion of the obtainment of the first and/or second data sets; and the method comprises providing a visual representation of the data set/s for a user-controlled manipulation of the visual representation.

10. The method of claim 1, the method comprising adapting at least one of:
    a rate of scanning in dependence on the portion of the vessel to be inspected; and
    a resolution of scanning in dependence on the portion of the vessel to be inspected.

11. Computer software which, when executed by a processing means, is arranged to perform a method according to claim 1, wherein the computer software is stored on a computer readable non-transitory medium.

12. The method of claim 1, wherein the vessel comprises a marine vessel and the portion of the vessel is on or part of at least one of: a moving ship, a Floating Production Storage and Offloading unit (FPSO), a Mobile Offshore Drilling Unit, and an Accommodation Vessel.

13. The method of claim 6, wherein the method comprises aligning at least one data point from the first data set with at least one data point from the second data set, the data points for alignment being indicative of a reference common to each scan and data set.

14. The method of claim 8, wherein the method comprises associating a time with each data set, the time being indicative of when the data points of each data set was obtained, such that each data point is indicative of a 4-dimensional measurement, comprising a 3-dimensional position and a time associated with that 3-dimensional position.

15. The method of claim 8, wherein the method comprises synchronising at least two scanners, and scanning the first and second surfaces with respective first and second scanners concurrently such that each of the first and second data sets comprises at least overlapping times.

16. The method of claim 13, wherein the method comprises scanning the reference with each obtainment of data points.

17. The method of claim 13, the method comprising scanning the reference from each of the scanning locations to be associated with the reference, the reference being scannable from inside and outside the vessel.

18. The method of claim 16, wherein the reference is fixed and known relative to the portion of the vessel, the reference comprising a predetermined feature, the predetermined feature being identifiable in each data set; and wherein at least one reference comprises a portable reference, the method comprising fixing the portable reference relative to the portion of the vessel at a reference location and obtaining the first and second data sets with the reference at the reference location.

\* \* \* \* \*